(12) United States Patent
Lee et al.

(10) Patent No.: US 6,502,229 B2
(45) Date of Patent: Dec. 31, 2002

(54) METHOD FOR INSERTING ANTENNA DIODES INTO AN INTEGRATED CIRCUIT DESIGN

(75) Inventors: Kuo-Chun Lee, Fremont, CA (US); Xin Chang, Santa Clara, CA (US)

(73) Assignee: Oridus, Inc., Fremont, CA (US)

( * ) Notice: Subject to any disclaimer, the term of this patent is extended or adjusted under 35 U.S.C. 154(b) by 32 days.

(21) Appl. No.: 09/818,093

(22) Filed: Mar. 26, 2001

(65) Prior Publication Data

US 2002/0138817 A1 Sep. 26, 2002

(51) Int. Cl.$^7$ .................................................. G06F 17/50
(52) U.S. Cl. ........................................................ 716/12
(58) Field of Search ...................................... 716/1, 8–21

(56) References Cited

U.S. PATENT DOCUMENTS 5,672,895 A  * 9/1997 Iida et al. .................... 257/203
6,389,584 B1 * 5/2002 Kitahara ........................ 716/11
2002/0066067 A1 * 5/2002 Wang et al. .................... 716/11

* cited by examiner

Primary Examiner—Tuan T. Lam
Assistant Examiner—Quan Tra
(74) Attorney, Agent, or Firm—Victor H. Okumoto

(57) ABSTRACT

A method and apparatus for inserting antenna diodes into an integrated circuit design is described. During the design process, diode cells are placed in filler cells of the integrated circuit design, but left unconnected. Subsequently, when an ECO is received requiring antenna diodes to be inserted in the integrated circuit design, only metal mask changes are required to connect the diode cells to gate electrodes of specified transistors or cells. Since the diode cells are already part of the original integrated circuit design layout, it is not necessary to perform a re-layout of the design cells with the diode cells performing antenna diode functions, thereby speeding up the EDA redesign process as well.

10 Claims, 8 Drawing Sheets

METHOD FOR INSERTING ANTENNA DIODES INTO AN INTEGRATED CIRCUIT DESIGN

FIELD OF THE INVENTION

The present invention relates in general to electronic design automation (EDA) systems for designing integrated circuit devices and in particular, to a method for inserting antenna diodes into an integrated circuit design.

BACKGROUND OF THE INVENTION

During the manufacture of integrated circuit devices, some of the devices may be damaged due to electrostatic charge build-up on the interconnections and their subsequent discharge through the gate oxide of certain transistors during chemical mechanical polishing (CMP) of wafers. A generally accepted practice to relieve transistors against such electrostatic discharge (ESD) is to insert antenna diodes into the IC design so as to provide alternative discharge paths.

Although the insertion of antenna diodes in the integrated circuit design is a simple approach to solving the ESD problem caused by CMP in the manufacturing process, the added components require significant redesign time since the integrated circuit design with the added antenna diodes must be entered at the beginning and proceed through the entire electronic design automation (EDA) process. In addition, the insertion of antenna diodes at this stage of the design requires a full set of new masks or reticles, making the retooling costs particularly high.

OBJECTS AND SUMMARY OF THE INVENTION

Accordingly, one object of the present invention is to provide a method for inserting antenna diodes into an integrated circuit design that minimizes redesign time.

Another object is to provide a method for inserting antenna diodes into an integrated circuit design that minimizes retooling costs.

These and additional objects are accomplished by the various aspects of the invention, wherein briefly stated, one aspect is a method for inserting antenna diodes into an integrated circuit design, comprising: placing design cells in an integrated circuit layout according to a netlist for an integrated circuit design including transistors having gate electrodes; placing filler cells among the design cells in the integrated circuit layout; placing diode cells in the filler cells; routing the design cells according to the netlist so that the diode cells are left unconnected to the design cells; receiving an engineering change order including information of gate electrodes requiring antenna diodes to be coupled to the gate electrodes to reduce electrostatic discharge through the gate electrodes and based upon an analysis of failures of integrated circuit devices generated from the integrated circuit design; determining a corresponding one of the plurality of diode cells for each of the gate electrodes; modifying the netlist to include the corresponding ones of the plurality of diode cells; and routing the design cells and the corresponding ones of the plurality of diode cells according to the modified netlist. Thus, by placing the diode cells in the layout of the original integrated circuit design, only metal mask changes are required in a subsequent redesign to include desired antenna diodes that provide alternative discharge paths for electrostatic discharge during CMP. Also, a re-layout to include the diode cells is not required, thereby reducing redesign time in the EDA process.

Another aspect is a method for inserting antenna diodes into an integrated circuit design having design cells placed according to a netlist, filler cells placed among the design cells, and diodes placed in the filler cells, comprising: receiving information of gate electrodes of the design cells requiring antenna diodes to be coupled to the gate electrodes to reduce electrostatic discharge through the gate electrodes, wherein the information is based upon an analysis of failures of integrated circuit devices generated from the integrated circuit design; determining a corresponding one of the plurality of diode cells for each of the gate electrodes; modifying the netlist to include the corresponding ones of the plurality of diode cells; and routing the design cells and the corresponding ones of the plurality of diode cells according to the modified netlist.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
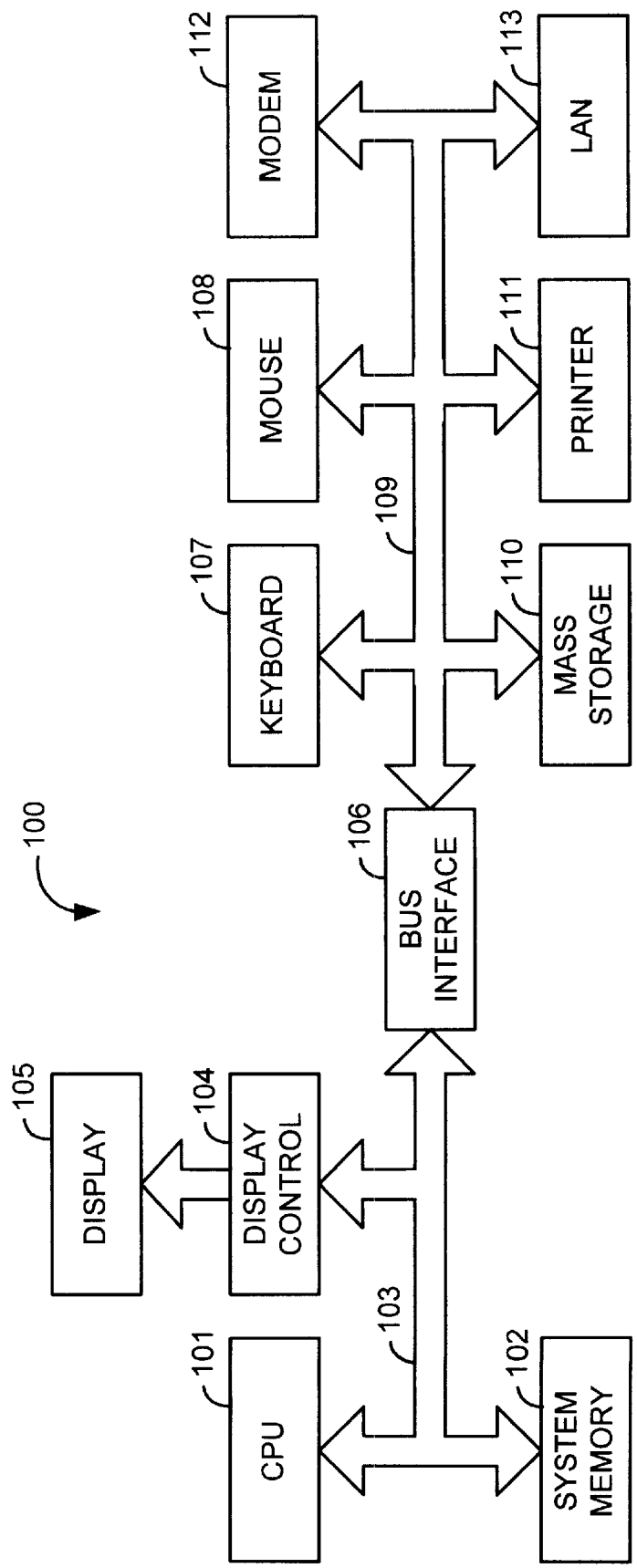
FIG. 1 illustrates, as an example, a block diagram of an EDA system utilizing aspects of the present invention.

FIG. 1 illustrates a block diagram of an EDA system 100. Included in the EDA system 100 are a central processing unit (CPU) 101 such as those typically employed in engineering workstations, system memory 102 such as conventional dynamic random access memory (DRAM), mass storage 110 such as one or more hard disk drive units, and a number of input and output devices for user interaction with the EDA system 100. In this example, the input devices include a keyboard 107 and a user manipulated pointing device such as a mouse 108. Output devices include a computer display 105 such as a cathode ray tube (CRT) or liquid crystal display (LCD) monitor, and a printer 111. Other output devices such as a plotter may also be typically included in the EDA system 100.

The CPU 101 is coupled to the system memory 102, a display controller 104, and a bus interface 106 through a system bus 108. The bus interface 106 couples the keyboard 107, the mouse 108, the mass storage 110, and the printer 111 to the CPU 101 through a peripheral bus 109 and the system bus 103. The display controller 104 couples the computer display 105 to the CPU 101 through the system bus 103. A modem 112 and local area network (LAN) connection 113 are also included for communication purposes with other computer systems or databases, as well as downloading programs and data, for example, into the mass storage 110 of the EDA system 100.

Figure 2:
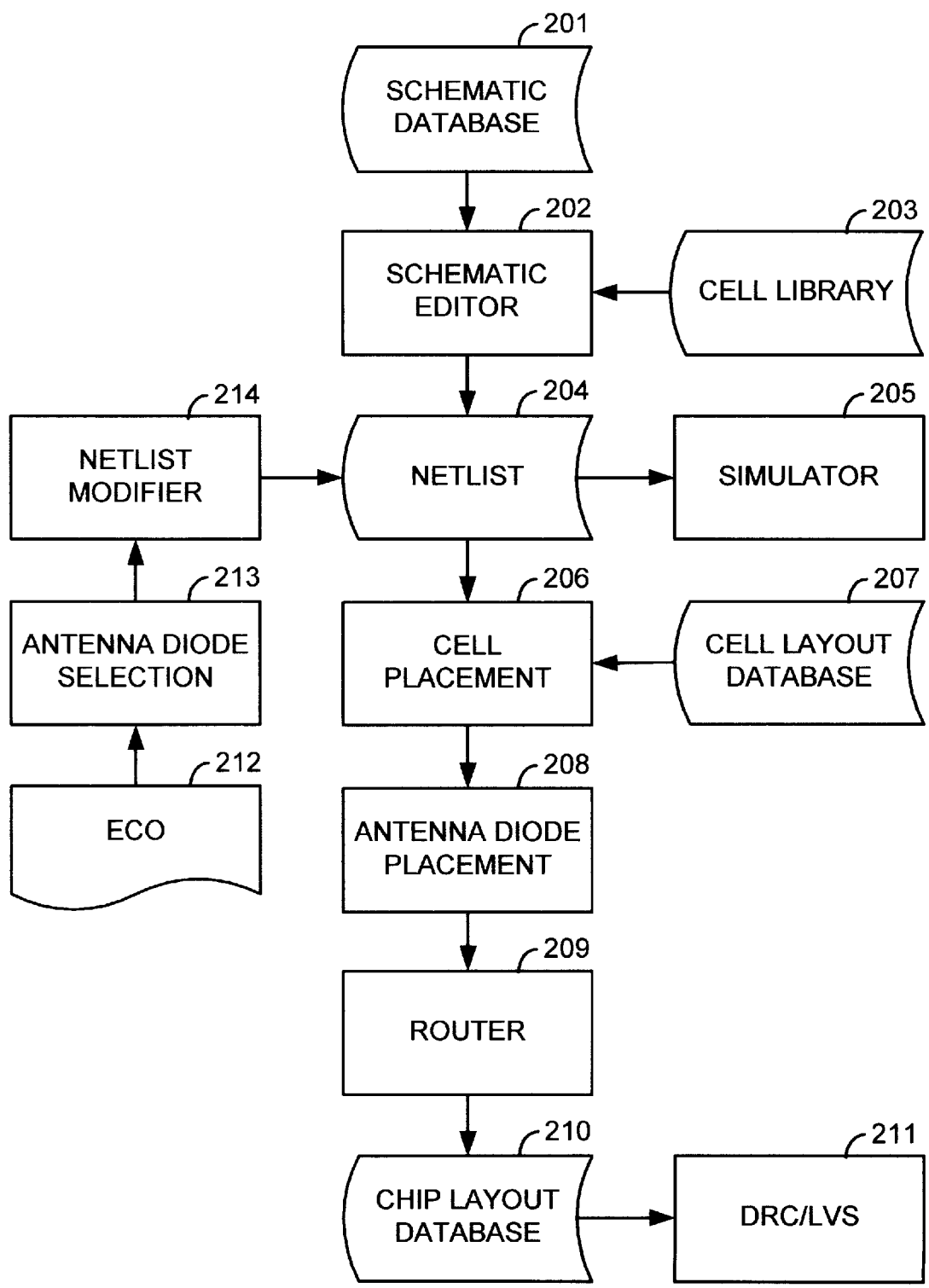
FIG. 2 illustrates, as an example, a chart of cooperative software modules and databases included in an EDA system, utilizing aspects of the present invention.

FIG. 2 illustrates, as an example, a chart of cooperative software modules and databases includable in the EDA system 100. In this example, a schematic editor module 202 (also referred to herein as a "schematic capture program") operates in a conventional manner to allow a user of the EDA system 100 to enter (i.e., capture) an integrated circuit (IC) design by selecting schematic symbols or cells from a symbol or cell library database 203, and connect instances of the selected schematic symbols or cells together to define the IC design in a schematic database 201. The user (i.e., IC designer) typically performs such selection and connection functions by interacting with the schematic editor module 202 through the display 105, the keyboard 107 and the mouse 108.

A netlist 204, which is a "flattened" version of the IC design defined in the schematic database 201, is generated in a conventional manner by the schematic editor module 202 as needed. Alternatively, a conventional hardware description language (HDL) process may be used to generate the netlist 204 instead of the described schematic capture process.

A number of software modules in the EDA system 100 access the netlist 204. Simulation programs cumulatively depicted as simulator module 205 access the netlist 204 to facilitate testing of the captured IC design. For example, a functional simulation program facilitates checking the logical integrity of the captured IC design in a conventional manner by comparing expected outputs provided as a series of output test vectors against simulated outputs resulting from simulation inputs provided as a series of input test vectors to the functional simulator. A timing analysis simulation program, on the other hand, performs pre-layout and/or post-layout timing analysis of the captured IC design in a conventional manner using timing models calculated from device parameters stored in a technology database (not shown).

Also accessing the netlist 204 is a cell placement module 206 which lays out the captured IC design in a conventional manner onto a chip floor plan that is stored in a chip layout database 210. In particular, the cell placement module 206 places mask-level layouts of cells contained in a cell layout database 207 onto the chip floor plan for each of the schematic symbol instances defined in the netlist 204.

Figure 4:
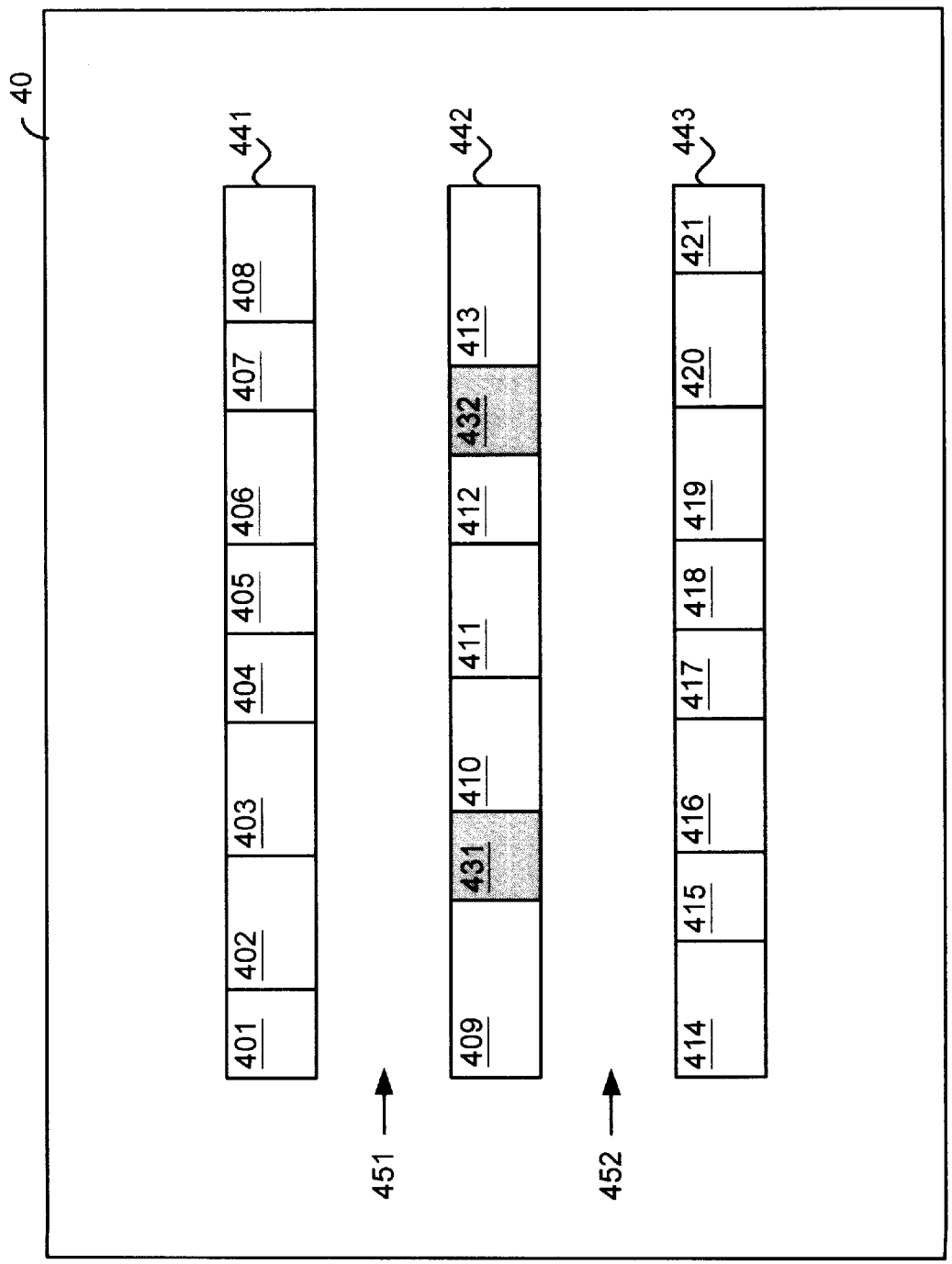
FIG. 4 illustrates, as an example, a top plan view of an integrated circuit design layout depicting placed, but not routed cells.

A simplified example of such a chip floor plan is depicted in a top plan view of an IC design layout 40 in FIG. 4 for a two metal layer technology. A two metal layer example is used so as to simplify description of the claimed invention. It is not to be construed to limit the invention in any way, however. The claimed invention is fully applicable to higher number of metal layer technologies as well.

In the two metal layer example, the cell placement module 206 places integrated circuit design cells 401 to 421 in rows 441, 442 and 443 that are separated by routing channels 451 and 452. In addition, the cell placement module 206 places feed-through cells 431 and 432 in the row 442 so as to provide routing paths between adjacent routing channels 451 and 452 through the row 442.

An antenna diode placement module 208 places mask-level layouts of diode cells 531 and 532 (shown in FIG. 5) in the feed-through cells 431 and 432. As with the design cells previously placed, the diode cell is also contained in the cell layout database 207. The antenna diode placement module 208, however, does not add the diode cells to the netlist 204. The antenna diode placement module 208 may be a stand-alone module as depicted in FIG. 2. Alternatively, it may be part of the cell placement module 206. In this latter case, a user of the EDA system 100 through available features of the cell placement module 206 may place the diode cells 531 and 532 in the feed-through cells 431 and 432.

A router module 209 routes interconnection wires connecting the mask-level cell layouts according to connectivity information for the schematic symbol instances included in the netlist 204. Since the diode cells placed by the antenna diode placement module 208 are not included in the netlist 204, they are not connected to the design cells. The output of the router module 209 resides in the chip layout database 210. The router module 209 may be a stand-alone module as depicted in FIG. 2. Alternatively, it may be part of the cell placement module 206. As can be appreciated, it does not generally matter how the modules described in FIG. 2 are configured to practice the present invention, as long as a mechanism is available to place diode cells in the feed-through cells so that the diode cells become part of the IC design layout without being connected to any design cells at this stage.

Figure 5:
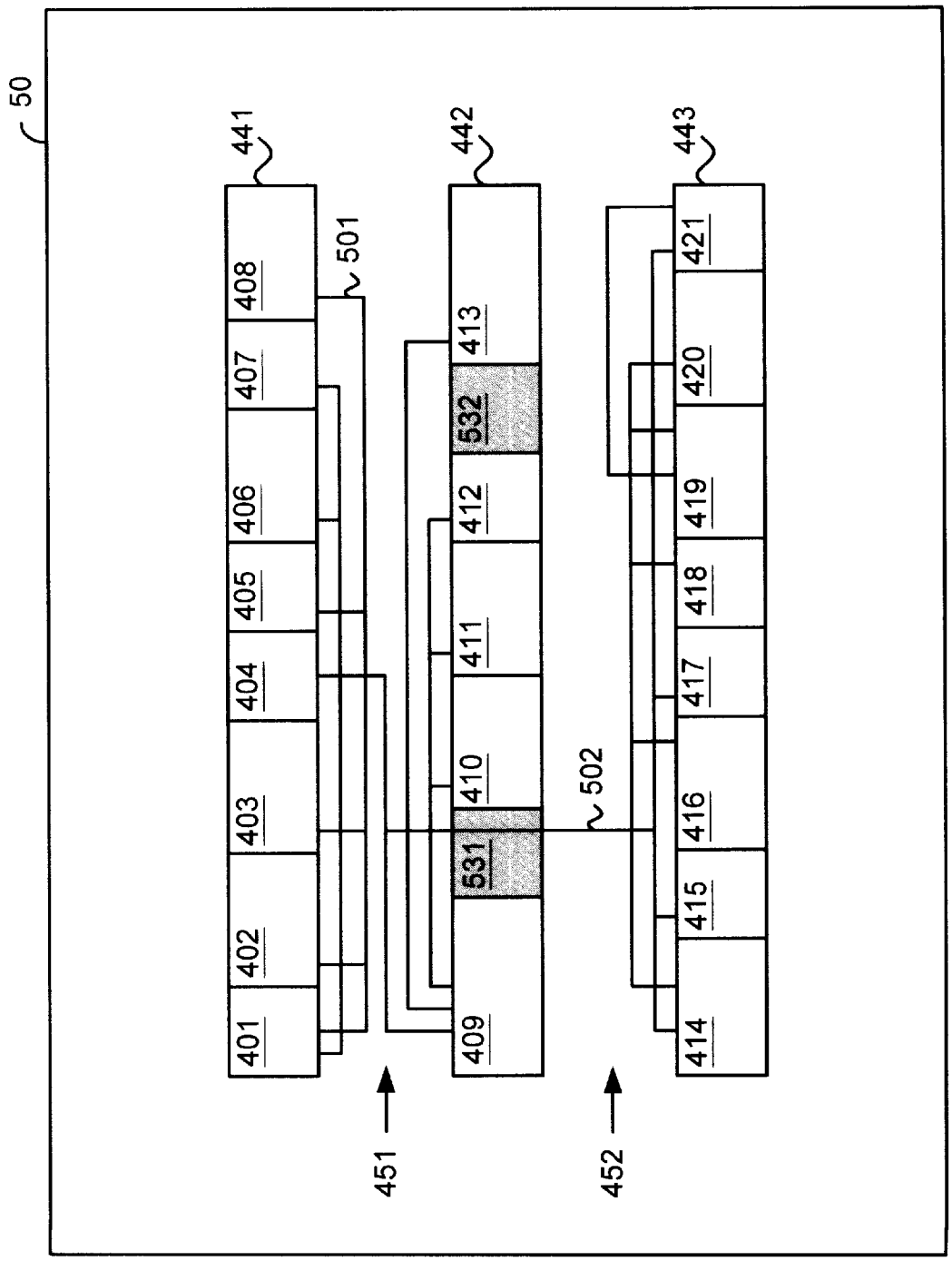
FIG. 5 illustrates, as an example, a top plan view of an integrated circuit design layout depicting placed and routed design cells with unconnected diode cells placed in filler cells, utilizing aspects of the present invention.

A simplified example of such a placed and routed IC design layout is depicted in a top plan view of the IC design layout 50 in FIG. 5, which represents the IC design layout 40 after the antenna diode placement module 208 has inserted diode cells 531 and 532 in the feed-through cells previously identified as 431 and 432 in FIG. 4, and after the router module 209 has routed the design cells 401 to 421. In the example, a representative interconnection 501 is shown coupling design cells 401, 402, 403, 405 and 408. Also, an interconnection 502 is shown routing through the feed-through cell previously identified as 431 and now including diode cell 531, so that design cell 404 in row 441, design cell 409 in row 442, and design cells 414, 415, 417, and 421 in row 443 are coupled together. Note that diode cells 531 and 532, although included as part of the IC design layout 50, are not coupled to any of the design cells 401 to 421 at this stage.

Conventional layout verification tools such as a design rule checker (DRC) and a layout vs. schematic comparator (LVS) are employed to further check the captured IC design. For convenience, the DRC and LVS modules are depicted as a single module 211 in FIG. 2 even though in practice they are generally separate modules. The DRC checks for geometrical rule layout errors in the chip layout database 210, and the LVS compares logic, sizing and connectivity information extracted from the integrated circuit layout in the chip layout database 210 to logic, sizing and connectivity information in the netlist 204. After a successful DRC and LVS, a set of masks or reticles may be manufactured from data in the chip layout database 210 in order to manufacture integrated circuit devices according to the IC design.

During the manufacture of the integrated circuit devices, some of the devices may be damaged due to electrostatic charge build-up on the interconnections and their subsequent discharge through the gate oxide of certain transistors during chemical mechanical polishing (CMP) of wafers. A generally accepted practice to relieve transistors against such electrostatic discharge is to insert so-called "antenna" diodes into the IC design so as to provide alternative discharge paths. These are ordinary diodes that get their special name, because of their use in this application.

An engineering change order (ECO) 212 is generated based upon analysis of failures of the integrated circuit devices. The ECO 212 indicates particular gate electrodes of transistors and/or input nodes of cells in the integrated circuit design that are particularly prone to failure due to electrostatic discharge resulting from CMP during the manufacturing process. Antenna diodes are to be added in this case to the integrated circuit design so as to be coupled with the indicated gate electrodes or input nodes, and serve as an electrostatic discharge path to protect the gate electrodes or input nodes. For convenience throughout this description and the attached claims, the term "gate electrodes" as used herein shall be understood to mean and include both gate electrodes of transistors and input nodes of cells.

An antenna diode selection module 213 receives the information of gate electrodes prone to failure due to electrostatic discharge. The antenna diode selection module 213 then finds the closest available diode cell previously placed in a feed-through cell for each of the gate electrodes. The term "closest" as used in this description and the attached claims, means the diode cell that would result in the shortest interconnection path to the gate electrode. Because of routing considerations, the diode cell resulting in the shortest interconnection path may not be the same diode cell that is physically closest to the gate electrode. Also, sometimes the closest diode cell is not available for a gate electrode if another gate electrode has already been assigned that diode cell. Therefore, in order to properly allocate diode cells, a priority system is preferably employed where gate electrodes most prone to failure due to electrostatic discharge are assigned diode cells before gate electrodes less prone to failure due to electrostatic discharge.

A netlist modifier module 214 receives information from the antenna diode selection module 213 on the diode cells selected to function as antenna diodes along with the transistor gate electrodes indicated in the ECO 212, and modifies the netlist 204 to include the diode cells and their connectivity information in a modified netlist 204'.

After modifying the netlist 204, the router module 209 reroutes the integrated circuit design according to the modified netlist 204' so that the selected diode cells are properly connected to their corresponding gate electrodes as indicated in the ECO 212. Since the diode cells have already been placed in the original integrated circuit design layout, the cell placement module 206 and the antenna diode placement module 208 are bypassed, thereby speeding up the redesign time through the EDA process.

Figure 6:
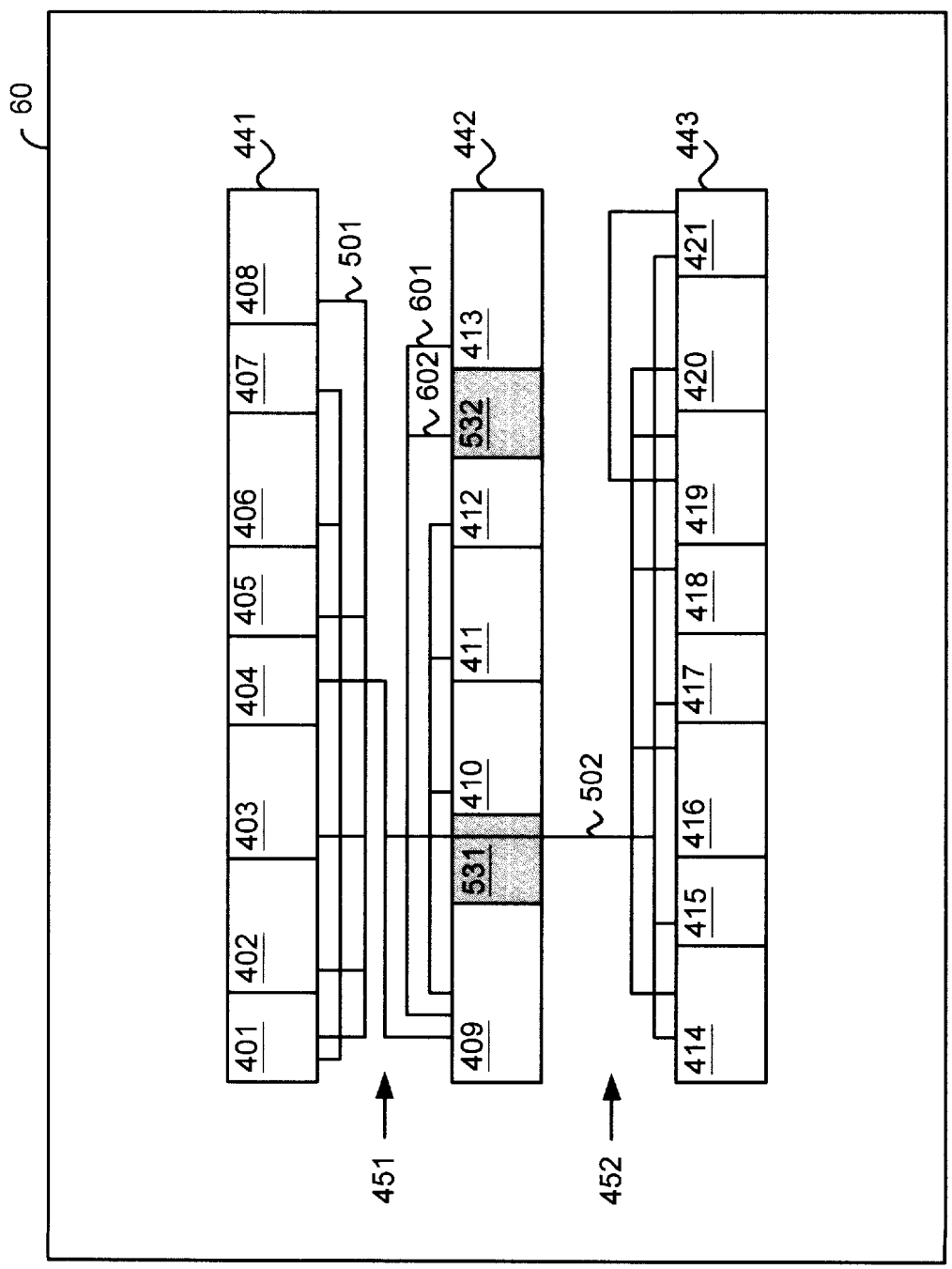
FIG. 6 illustrates, as an example, a top plan view of an integrated circuit design layout depicting placed and routed design cells with diode cell connected to one of the gate electrodes of a design cell to reduce electrostatic discharge through the gate electrode, utilizing aspects of the present invention.

A simplified example of such a rerouted IC design layout is depicted in a top plan view of the IC design layout 60 in FIG. 6, which represents the IC design layout 50 after the antenna diode selection module 213 has determined the diode cells that are to be connected to gate electrodes as indicated in the ECO 212, and after the router module 209 has routed the selected diode cells to their corresponding gate electrodes. In the example, only the input node to design cell 413 requires an antenna diode to be coupled to it. Since diode cell 532 is closer than diode cell 531 to the input node of design cell 413, diode cell 532 is selected by the antenna diode selection module 213 to be coupled to the input node of design cell 413.

Although the router module 209 is generally used to re-route the integrated circuit design using the modified netlist 204', sometimes it is a simpler matter to merely manually connect a selected diode cell to an input node of a design cell indicated by the ECO 212. For example, referring to FIG. 6, it is apparent that it is simpler to connect diode cell 532 to the input node of design cell 413 by adding an interconnect 602 and connecting it to interconnect 601 in the integrated circuit design layout.

Figure 3:
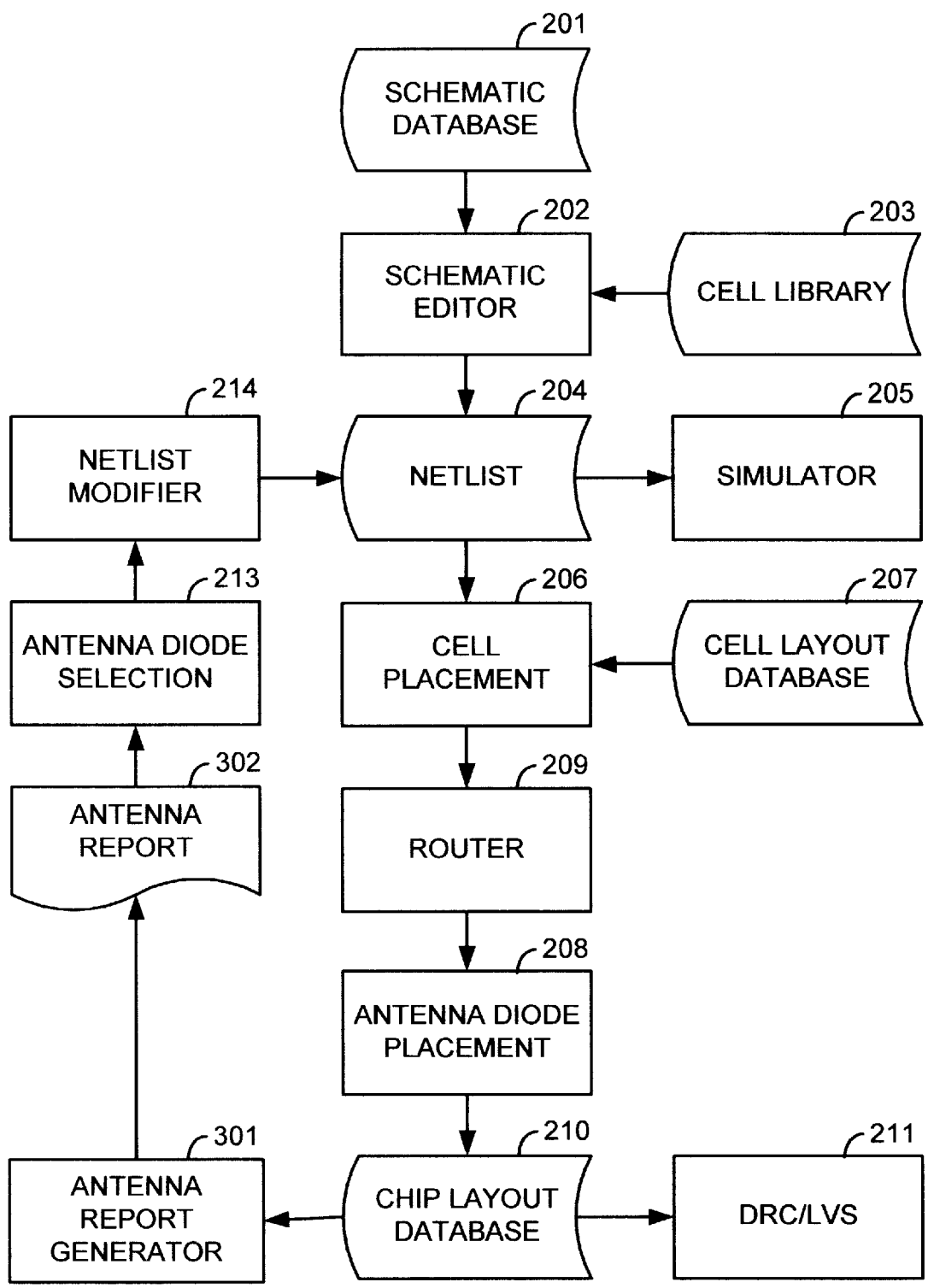
FIG. 3 illustrates, as another example, a chart of cooperative software modules and databases included in an EDA system, utilizing aspects of the present invention.

FIG. 3 illustrates, as another example, a chart of cooperative software modules and databases includable in the EDA system 100. Modules and databases 201 through 211 function the same as described in reference to FIG. 2, except that antenna diode placement module 208 is shown in FIG. 3 as operating after the router module 209 to demonstrate that it doesn't matter whether the diode cells are placed in the feed-through cells before or after routing in order to practice the present invention.

The primary difference between FIG. 3 and FIG. 2, however, is that the antenna diode requirements are determined by simulation techniques in FIG. 3 whereas they are determined by analysis of actual failures of integrated circuit devices in FIG. 2. In FIG. 3, an antenna report generator module 301 generates an antenna report 302 generally including the same type of information as the ECO 212 except that the information is from simulation results, not from actual device failure analysis data. Antenna diode selection module 213 and netlist modifier module 214, then operate on the information provided by the antenna report 302 in the same fashion as described in reference to FIG. 2 with respect to their operation on the information provided by the ECO 212.

For higher number of metal layer technologies, the layouts depicted in FIGS. 4–6 may be modified. For example, with the higher number of metal layers, routing over cells is feasible. Therefore, the cell rows may abut, eliminating the routing channels between them. In this case, there is no need for feed-through cells. However, to accommodate prospective routing congestion and for other reasons such as providing power and ground bus connectivity between adjacent design cells and avoiding design rule violations, so-called gap or filler cells are conventionally inserted among the integrated circuit design cells by modern cell placement modules. Accordingly, to practice the present invention in this case, diode cells are to be placed in the gap or filler cells and thereafter employed in the same manner as the diode cells placed in the feed-through cells in the two metal layer example. Therefore, as used herein, the terms filler cell, gap cell and feed-through cell may be used interchangeably for the purposes of this invention.

Figure 7:
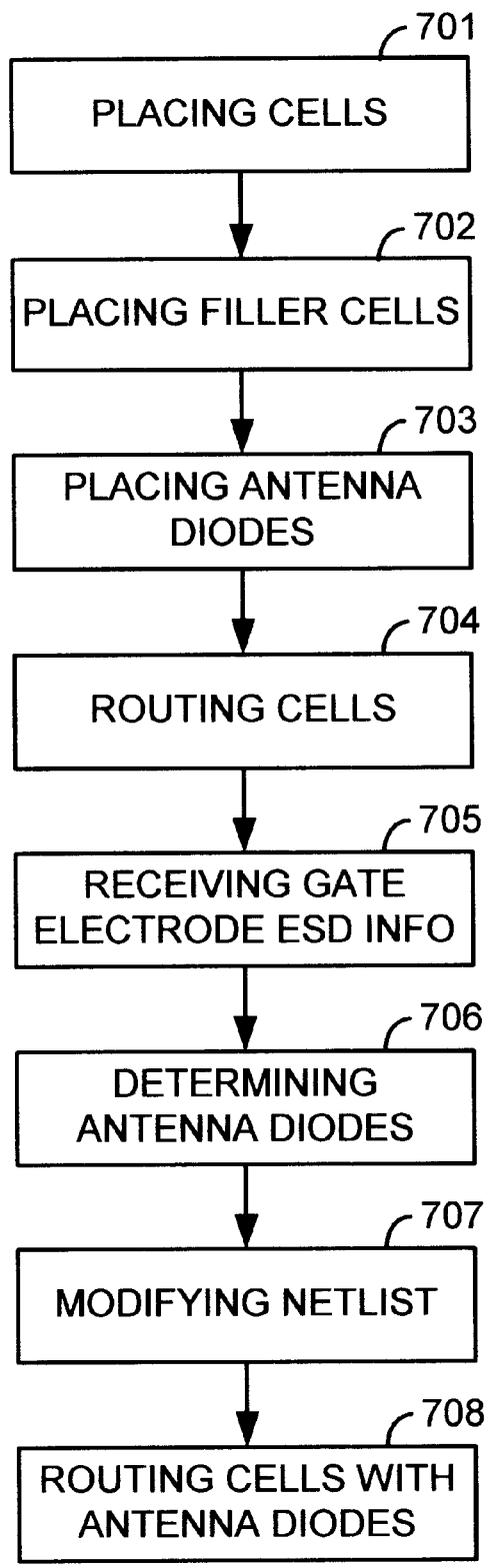
FIG. 7 illustrates, as an example, a method for inserting antenna diodes into an integrated circuit design, utilizing aspects of the present invention.

FIG. 7 illustrates, as an example, a method for inserting antenna diodes in an integrated circuit design. In 701, placing design cells (e.g., 401~421 in FIG. 4) in an integrated circuit layout according to a netlist (e.g., 204 in FIG. 2) for an integrated circuit design is performed. In 702, placing filler cells (e.g., 431~432 in FIG. 4) among the design cells in the integrated circuit layout is performed. In 703, placing a plurality of diode cells (e.g., 531~532 in FIG. 5) in the filler cells (e.g., 431~432 in FIG. 4) is performed. In 704, routing the design cells (e.g., 401~421 in FIG. 5) according to the netlist (e.g., 204) so that the plurality of diode cells (e.g., 531~532) are left unconnected to the design cells is performed.

In 705, receiving information of gate electrodes (e.g., input node of design cell 413 in FIG. 6) prone to failure due to electrostatic discharge is performed. As an example, such information may be provided in the form of an engineering change order (e.g., 212 in FIG. 2) including information of gate electrodes of transistors requiring antenna diodes to be coupled to the gate electrodes to reduce electrostatic discharge through the gate electrodes. In such case, typically the engineering change order is based upon analysis of failures of integrated circuit devices generated from the integrated circuit design.

In 706, determining a corresponding one (e.g., 532) of the plurality of diode cells for each of the gate electrodes or input nodes (e.g., input node to design cell 413) identified in 705 is performed. Preferably, the corresponding one of the plurality of diode cells so determined is a closest available one (e.g., 532) of the plurality of diode cells to their respective gate electrode or input node (e.g., input node to design cell 413).

In 707, modifying the netlist (e.g., 204) to include the corresponding ones (e.g., 532) of the plurality of diode cells is performed. Each of the added ones (e.g., 532) of the plurality of diode cells is included in the modified netlist (e.g., 204') as being coupled to a corresponding one of the gate electrodes or input nodes (e.g., input node of design cell 413) so as to reduce electrostatic discharge through the corresponding one of the gate electrodes or input nodes.

In 708, routing the design cells (e.g., 401~421 in FIG. 6) and corresponding ones of the plurality of diode cells (e.g., 532 in FIG. 6) according to the modified netlist (e.g., 204') is performed. This may be accomplished by employing a router module (e.g., 209 in FIG. 2) to re-route all of the design cells along with the added diode cells, or it may be accomplished by employing other conventional means to manually connect the added diode cells to the original routing of the design cells.

Figure 8:
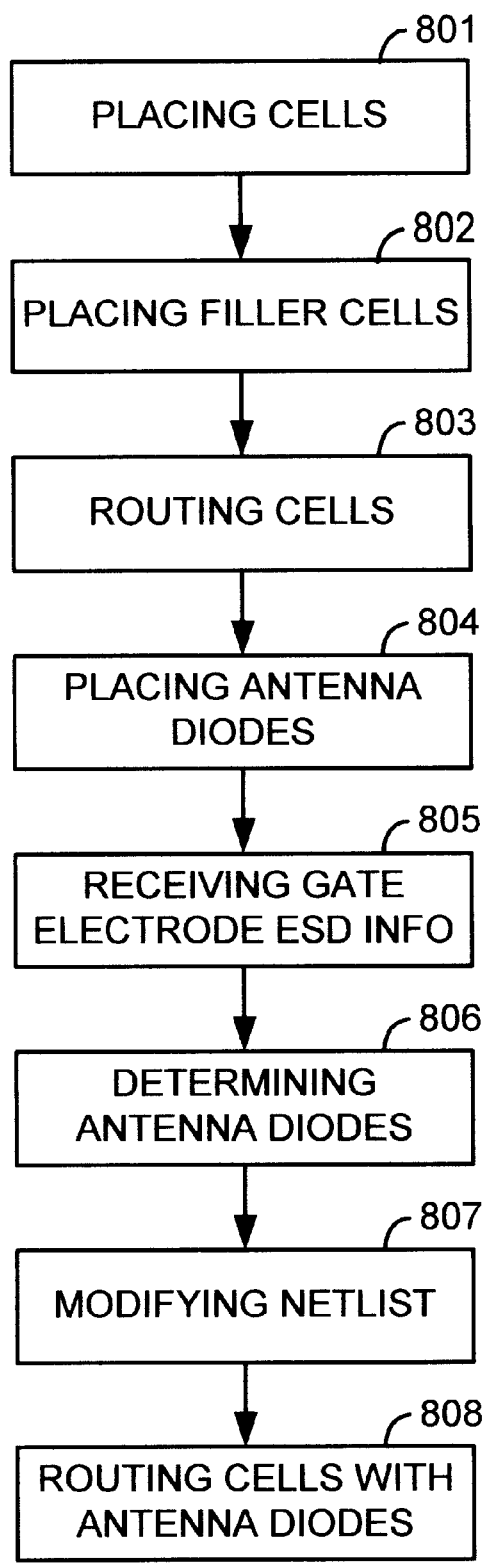
FIG. 8 illustrates, as another example, a method for inserting antenna diodes into an integrated circuit design, utilizing aspects of the present invention.

FIG. 8 illustrates, as another example, a method for inserting antenna diodes in an integrated circuit design. In the method, 801 to 804 and 806 to 809 are each performed in the same manner as their counterparts, 701 to 704 and 706 to 709 in the method described in reference to FIG. 7, except that 804 in this method is performed after 803, whereas its counterpart 703 in FIG. 3 is performed before 704 (which is the counterpart to 803).

In 805, receiving information of gate electrodes or input nodes (e.g., input node of design cell 413 in FIG. 6) prone to failure due to electrostatic discharge is performed. In the present method, such information may be provided in the form of an antenna report (e.g., 302 in FIG. 3) including information of gate electrodes of transistors requiring antenna diodes to be coupled to the gate electrodes to reduce electrostatic discharge through the gate electrodes during CMP. In such case, typically the antenna report is based upon simulated analysis of a layout of the placed and routed cells of the integrated circuit design.

Although the various aspects of the present invention have been described with respect to a preferred embodiment, it will be understood that the invention is entitled to full protection within the full scope of the appended claims.

We claim:

1. A method for inserting antenna diodes into an integrated circuit design, comprising:
   placing design cells in an integrated circuit layout according to a netlist for an integrated circuit design including transistors having gate electrodes;
   placing filler cells among said design cells in said integrated circuit layout;
   placing a plurality of diode cells in said filler cells;
   routing said design cells according to said netlist so that said plurality of diode cells are left unconnected to said design cells;
   receiving an engineering change order including information of gate electrodes requiring antenna diodes to be coupled to said gate electrodes to reduce electrostatic discharge through said gate electrodes and based upon an analysis of failures of integrated circuit devices generated from said integrated circuit design;
   determining a corresponding one of said plurality of diode cells for each of said gate electrodes;
   modifying said netlist to include said corresponding ones of said plurality of diode cells; and
   routing said design cells and said corresponding ones of said plurality of diode cells according to said modified netlist.

2. The method according to claim 1, wherein said determining a corresponding one of said plurality of diode cells for each of said gate electrodes, comprises determining a closest available one of said plurality of diode cells to each of said gate electrodes.

3. The method according to claim 1, wherein said modifying said netlist to include said corresponding one of said plurality of diode cells for each of said gate electrodes, comprises modifying said netlist such that each of said added ones of said plurality of diode cells is coupled to a corresponding one of said gate electrodes so as to reduce electrostatic discharge through said corresponding one of said gate electrodes.

4. The method according to claim 1, wherein said routing said design cells and said corresponding ones of said plurality of diode cells according to said modified netlist, comprises re-routing said design cells to include said corresponding ones of said plurality of diode cells according to said modified netlist.

5. The method according to claim 1, wherein said routing said design cells and said corresponding ones of said plurality of diode cells according to said modified netlist, comprises coupling said corresponding ones of said plurality of diode cells to said gate electrodes so as to reduce electrostatic discharge through said gate electrodes without re-routing said design cells.

6. A method for inserting antenna diodes into an integrated circuit design having design cells placed according to a netlist, filler cells placed among said design cells, and diodes placed in said filler cells, comprising:
   receiving information of gate electrodes of said design cells requiring antenna diodes to be coupled to said gate electrodes to reduce electrostatic discharge through said gate electrodes, wherein said information is based upon an analysis of failures of integrated circuit devices generated from said integrated circuit design;
   determining a corresponding one of said plurality of diode cells for each of said gate electrodes;
   modifying said netlist to include said corresponding ones of said plurality of diode cells; and
   routing said design cells and said corresponding ones of said plurality of diode cells according to said modified netlist.

7. The method according to claim 6, wherein said determining a corresponding one of said plurality of diode cells for each of said gate electrodes, comprises determining a closest available one of said plurality of diode cells to each of said gate electrodes.

8. The method according to claim 6, wherein said modifying said netlist to include said corresponding one of said plurality of diode cells for each of said gate electrodes, comprises modifying said netlist such that each of said added ones of said plurality of diode cells is coupled to a corresponding one of said gate electrodes so as to reduce electrostatic discharge through said corresponding one of said gate electrodes.

9. The method according to claim 6, wherein said routing said design cells and said corresponding ones of said plurality of diode cells according to said modified netlist, comprises re-routing said design cells to include said corresponding ones of said plurality of diode cells according to said modified netlist.

10. The method according to claim 6, wherein said routing said design cells and said corresponding ones of said plurality of diode cells according to said modified netlist, comprises coupling said corresponding ones of said plurality of diode cells to said gate electrodes so as to reduce electrostatic discharge through said gate electrodes without re-routing said design cells.

* * * * *